US012787742B2

(12) United States Patent
Kim et al.

(10) Patent No.: US 12,787,742 B2
(45) Date of Patent: Nov. 3, 2026

(54) INTEGRATED CIRCUIT DEVICES INCLUDING STACKED TRANSISTORS AND METHODS OF FORMING THE SAME

(71) Applicant: Samsung Electronics Co., Ltd., Suwon-si (KR)

(72) Inventors: Jintae Kim, Clifton Park, NY (US); Keumseok Park, Slingerlands, NY (US); Kang-Ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 579 days.

(21) Appl. No.: 18/448,482

(22) Filed: Aug. 11, 2023

(65) Prior Publication Data

US 2024/0332131 A1 Oct. 3, 2024

Related U.S. Application Data

(60) Provisional application No. 63/492,874, filed on Mar. 29, 2023.

(51) Int. Cl.

*H10W 20/20* (2026.01)
*H10D 30/01* (2025.01)
(Continued)

(52) U.S. Cl.

CPC .......... *H10W 20/20* (2026.01); *H10D 30/014* (2025.01); *H10D 30/43* (2025.01);
(Continued)

(58) Field of Classification Search

CPC ............. H10D 84/853; H10D 30/6735; H10D 30/6757; H10D 62/121; H10D 62/151;
(Continued)

(56) References Cited

U.S. PATENT DOCUMENTS 11,081,484 B2 8/2021 Zhu et al.
11,374,024 B2 6/2022 Lilak et al.
(Continued)

OTHER PUBLICATIONS

Extended European Search Report corresponding to EP 24166314.5. Dated Aug. 27, 2024, (10 pages).

*Primary Examiner* — Jonathan Han
(74) *Attorney, Agent, or Firm* — Myers Bigel, P.A.

(57) ABSTRACT

Integrated circuit devices may include a power switch cell including an upper transistor on a substrate and a lower transistor between the substrate and the upper transistor. The upper transistor may include an upper channel region, first and second upper source/drain regions, and an upper gate electrode on the upper channel region. The lower transistor may include a lower channel region, first and second lower source/drain regions, and a lower gate electrode on the lower channel region. The first and second upper source/drain regions and the first and second lower source/drain regions may have the same conductivity type, the first upper source/drain region and the first lower source/drain region may be electrically connected to each other, the second upper source/drain region and the second lower source/drain region may be electrically connected to each other, and the upper and lower gate electrodes may be electrically connected to each other.

20 Claims, 15 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 84/01*** | (2026.01) |
| ***H10D 84/03*** | (2025.01) |
| ***H10D 84/83*** | (2025.01) |
| ***H10D 88/00*** | (2026.01) |

(52) U.S. Cl.
CPC ..... *H10D 30/6729* (2025.01); *H10D 30/6735* (2025.01); *H10D 30/6757* (2025.01); *H10D 62/121* (2025.01); *H10D 84/0128* (2025.01); *H10D 84/013* (2025.01); *H10D 84/038* (2025.01); *H10D 84/83* (2025.01); *H10D 88/00* (2025.01)

(58) Field of Classification Search
CPC .... H10D 30/014; H10D 30/43; H10D 64/258; H10D 64/254; H10D 84/85; H10D 84/83; H10D 84/0186; H10D 84/0149; H10D 84/038; H10D 88/00; H10D 88/01; H10D 30/6729; H10D 84/0128; H10D 84/013; H10D 30/0198; H10D 84/834; H10D 64/017; H10D 30/019; H10D 30/501; H10D 84/0177; H10D 84/83135; H01L 23/481; H01L 23/5226; H01L 23/5283; H01L 23/5286; H01L 25/0657; B82Y 10/00; H10B 10/12; H10W 20/20; H10W 20/42; H10W 20/427; H10W 20/435; H10W 90/00
See application file for complete search history.

(56) References Cited

U.S. PATENT DOCUMENTS

| | | | | |
|---|---|---|---|---|
| 2017/0005106 | A1 | 1/2017 | Zhang | |
| 2017/0053982 | A1 | 2/2017 | Cai et al. | |
| 2017/0148922 | A1 | 5/2017 | Hatcher et al. | |
| 2017/0358586 | A1 | 12/2017 | Huynh Bao et al. | |
| 2020/0006329 | A1 | 1/2020 | Lilak et al. | |
| 2020/0161300 | A1 | 5/2020 | Pille et al. | |
| 2022/0037497 | A1 | 2/2022 | Chung et al. | |
| 2022/0199624 | A1 * | 6/2022 | Huang | H10B 53/30 |
| 2023/0092061 | A1 | 3/2023 | Hong et al. | |
| 2023/0335557 | A1 | 10/2023 | Park et al. | |
| 2023/0345691 | A1 * | 10/2023 | Xie | H10D 30/6757 |

* cited by examiner

INTEGRATED CIRCUIT DEVICES INCLUDING STACKED TRANSISTORS AND METHODS OF FORMING THE SAME

CROSS-REFERENCE TO RELATED APPLICATION

This application claims priority to U.S. Provisional Application Ser. No. 63/492,874 entitled STACKED FIELD-EFFECT TRANSISTORS INCLUDING PFETS AND METHODS OF FORMING THE SAME, filed in the USPTO on Mar. 29, 2023, the disclosure of which is hereby incorporated by reference herein in its entirety.

BACKGROUND

The present disclosure generally relates to the field of integrated circuit devices and, more particularly, to three-dimensional integrated circuit devices that include stacked transistors.

Various structures of integrated circuit devices and methods of forming the same have been proposed to increase the integration density thereof as well as to simplify the middle-of-line (MOL) portion and/or the back-end-of-line (BEOL) portion of device fabrication. For example, a stacked transistor structure and a back side power distribution network structure (BSPDNS) have been proposed.

SUMMARY

An integrated circuit device according to some embodiments may include a power switch cell comprising: an upper transistor on a substrate and a lower transistor between the substrate and the upper transistor. The upper transistor comprises an upper channel region, first and second upper source/drain regions respectively on opposing sides of the upper channel region, and an upper gate electrode on the upper channel region. The lower transistor comprises a lower channel region, first and second lower source/drain regions respectively on opposing sides of the lower channel region, and a lower gate electrode on the lower channel region. The first and second upper source/drain regions and the first and second lower source/drain regions may have the same conductivity type, the first upper source/drain region and the first lower source/drain region may be electrically connected to each other, the second upper source/drain region and the second lower source/drain region may be electrically connected to each other, and the upper gate electrode and the lower gate electrode may be electrically connected to each other.

An integrated circuit device according to some embodiments may include an upper transistor on a substrate and a lower transistor between the substrate and the upper transistor. The upper transistor comprises an upper channel region, first and second upper source/drain regions respectively on opposing sides of the upper channel region, and an upper gate electrode. The lower transistor comprises a lower channel region, first and second lower source/drain regions respectively on opposing sides of the lower channel region, and a lower gate electrode. The upper transistor and the lower transistor may have the same conductivity type, the first upper source/drain region and the first lower source/drain region may be electrically connected to each other, and the second upper source/drain region and the second lower source/drain region may be electrically connected to each other.

A method of forming an integrated circuit device may include forming a lower transistor on a substrate. The lower transistor comprises a lower channel region, first and second lower source/drain regions respectively on opposing sides of the lower channel region, and a lower gate electrode. The method may also include forming an upper transistor on the lower channel region. The upper transistor comprises an upper channel region, first and second upper source/drain regions respectively on opposing sides of the upper channel region, and an upper gate electrode. The first lower source/drain region and the first upper source/drain region may have the same conductivity type. The first upper source/drain region and the first lower source/drain region may be electrically connected to each other, and the second upper source/drain region and the second lower source/drain region may be electrically connected to each other.

DETAILED DESCRIPTION

Example embodiments will be described in greater detail with reference to the attached figures.

Figure 1:
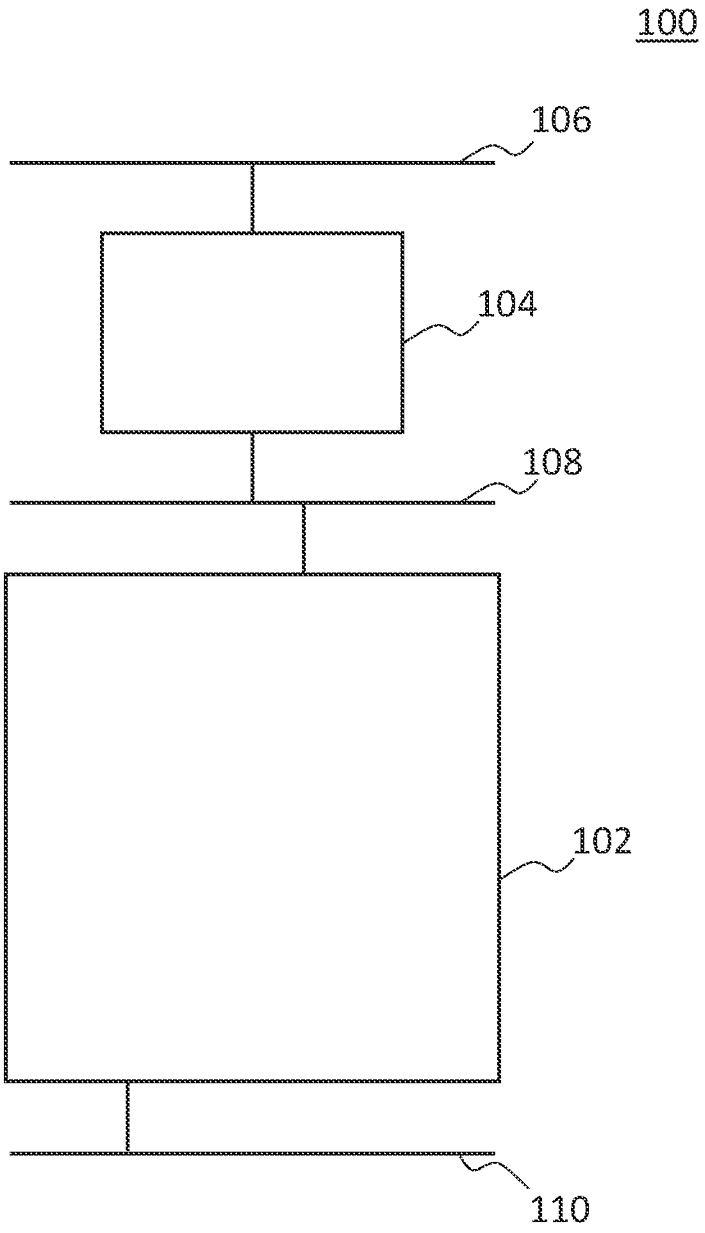
FIG. 1 is a diagram illustrating an integrated circuit device according to some embodiments.

FIG. 1 is a diagram illustrating an integrated circuit device 100 according to some embodiments. The integrated circuit device 100 may include a logic circuit block 102 and a power switch cell 104. The logic circuit block 102 may include, for example, a Central Processing Unit (CPU), a Graphics Processing Unit (GPU), and/or a general logic circuit and may also be referred to as a power gated block. The power switch cell 104 may also be referred to as a switch cell or a header switch. The power switch cell 104 may be electrically connected to a first power 106 having a first voltage (e.g., a drain voltage $V_{dd}$) and may supply a virtual power 108 to the logic circuit block 102 when the power switch cell 104 is on. In some embodiments, the first voltage may be a positive voltage. The virtual power 108 may also be referred to as a virtual drain voltage or a gated drain voltage. The logic circuit block 102 may be electrically connected to a second power 110 having a second voltage (e.g., a source voltage $V_{SS}$). In some embodiments, the second voltage may be a negative voltage (e.g., ground). Although FIG. 1 illustrates the power switch cell 104 is electrically connected to a single logic circuit block 102, in some embodiments, the power switch cell 104 may be electrically connected to multiple logic circuit blocks. The virtual power 108 may be always applied to the logic circuit block 102 while the power switch cell 104 is on.

The power switch cell 104 may be used to save power (e.g., reducing the leakage power) when the logic circuit block 102 is not in operation. On resistance ($R_{ON}$) of the power switch cell 104 should be low to reduce power leakage and voltage drop through the power switch cell 104 and to increase the operation speed of the power switch cell 104. On resistance ($R_{ON}$) of the power switch cell 104 may decrease as the number of transistors of the power switch cell 104 connected in parallel increases. The power leakage through the power switch cell 104 may depend on the conductivity types (e.g., N-type and P-type) of the transistors of the power switch cell 104. According to some embodiments, two transistors (e.g., a lower transistor 202 and an upper transistor 204 in FIG. 2A) connected in parallel may be stacked in a vertical direction (e.g., a Z direction in FIG. 4B, also referred to as a third direction) such that a unit transistor stack including those two transistors may be formed in an area that a single transistor occupies. On resistance ($R_{ON}$) of the power switch cell 104, therefore, may decrease without increasing an area of the power switch cell 104, according to some embodiments. However, the present inventive concept is not limited to the number of the transistors in the power switch cell 104.

Figure 2A:
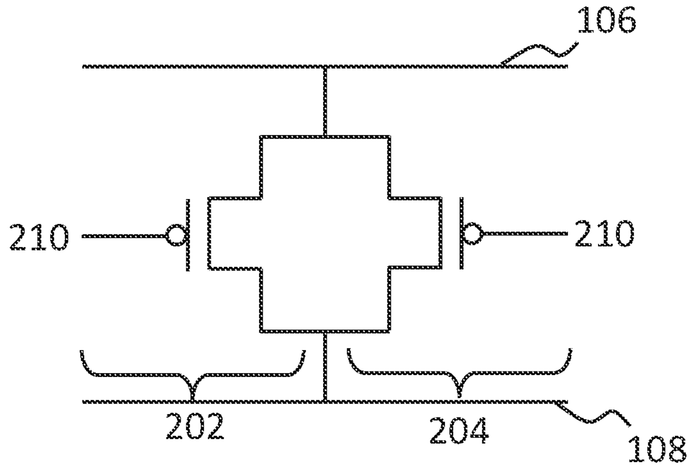
FIGS. 2A and 2B are each a circuit diagram of a unit transistor stack of a power switch cell according to some embodiments.
Figure 2B:
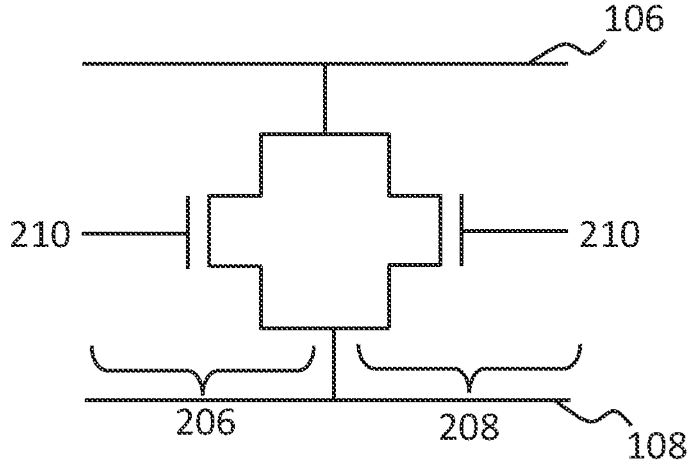

FIGS. 2A and 2B are each a circuit diagram of a unit transistor stack of the power switch cell 104, which includes two stacked transistors, according to some embodiments. In some embodiments, the lower transistor 202 and the upper transistor 204, both of which are P-type transistors, may be electrically connected to each other in parallel between the first power 106 and the virtual power 108, as illustrated in FIG. 2A. In some embodiments, a lower transistor 206 and an upper transistor 208, both of which are N-type transistors, may be electrically connected to each other in parallel between the first power 106 and the virtual power 108, as illustrated in FIG. 2B. Gates (e.g., lower and upper gate electrodes 416*a* and 416*b* in FIG. 4D) of the lower transistor 202, the upper transistor 204, the lower transistor 206 and the upper transistor 208 may receive a sleep signal 210 when the logic circuit block 102 is not in operation. Although each of the FIGS. 2A and 2B illustrates a single unit transistor stack, in some embodiments, the power switch cell 104 may include multiple unit transistor stacks. When sleep signal 210 is applied to the power switch cell 104, the first power 106 will be applied the logic circuit block 102.

Figure 3A:
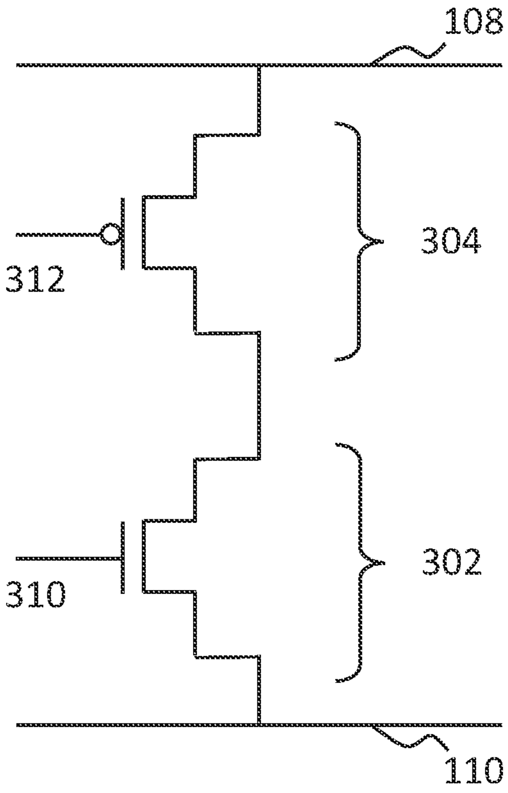
FIGS. 3A and 3B are each a circuit diagram of a unit logic transistor stack of a logic circuit block according to some embodiments.
Figure 3B:
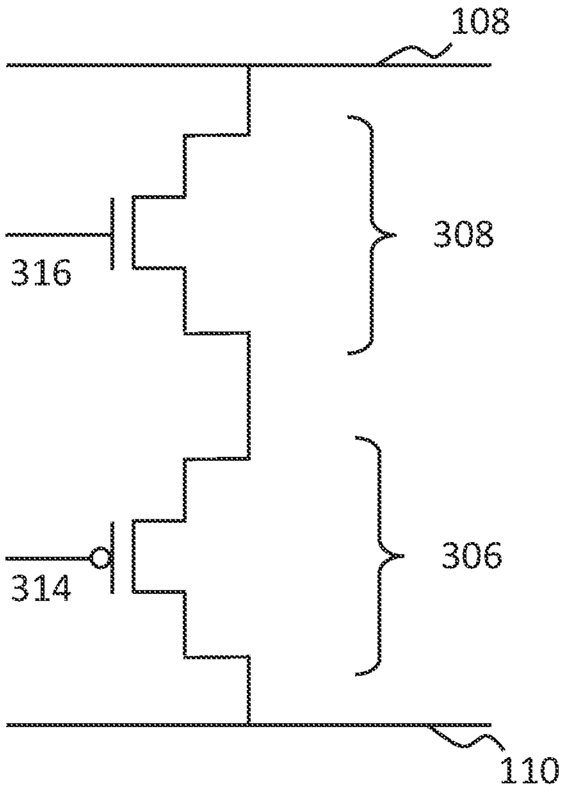

FIGS. 3A and 3B are each a circuit diagram of a unit logic transistor stack of the logic circuit block 102, which includes two stacked transistors, according to some embodiments. In some embodiments, a lower logic transistor 302 may be a N-type transistor, and an upper logic transistor 304 may be a P-type transistor, as illustrated in FIG. 3A. In some embodiments, a lower logic transistor 306 may be a P-type transistor, and an upper logic transistor 308 may be a N-type transistor, as illustrated in FIG. 3B. The lower logic transistor (e.g., the lower logic transistor 302 or 306) and the upper logic transistor (e.g., the upper logic transistor 304 or 308) may be electrically connected to each other in series between the virtual power 108 and the second power 110. Gates of the lower logic transistor 302, the upper logic transistor 304, the lower logic transistor 306, and the upper logic transistor 308 may receive a first lower gate signal 310, a first upper gate signal 312, a second lower gate signal 314 and a second upper gate signal 316, respectively. Although each of the FIGS. 3A and 3B illustrates a single unit logic transistor stack, in some embodiments, the logic circuit block 102 may include multiple unit logic transistor stacks. However, the present inventive concept is not limited to the number of the logic transistors or the connection therebetween in the logic circuit block 102.

Figure 4A:
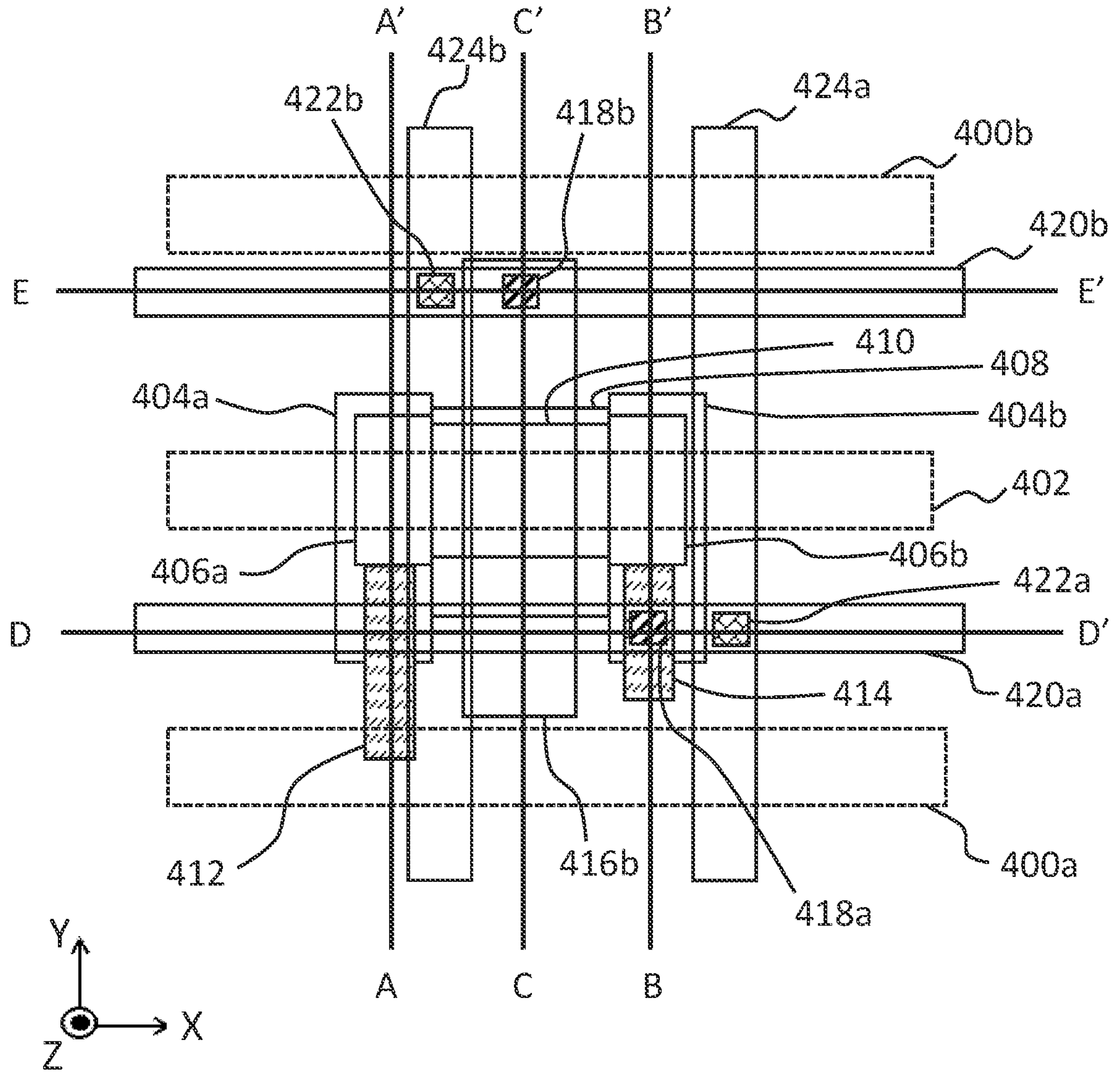
FIG. 4A is a layout of a unit transistor stack of a power switch cell, according to some embodiments.

FIG. 4A is a layout of a unit transistor stack of the power switch cell 104, according to some embodiments. FIGS. 4B, 4C, 4D, 4E, and 4F are, respectively, cross-sectional views taken along the line A-A', the line B-B', the line C-C', the line D-D' and the line E-E' in FIG. 4A, according to some embodiments.

Referring to FIGS. 4A through 4F, the unit transistor stack of the power switch cell 104 may include a lower transistor (e.g., the lower transistor 202 in FIG. 2A or the lower transistor 206 in FIG. 2B) including a first lower source/drain region 404*a*, a second lower source/drain region 404*b*, a lower channel region 408, and a lower gate electrode 416*a*. The unit transistor stack of the power switch cell 104 may also include an upper transistor (e.g., the upper transistor 204 in FIG. 2A or the upper transistor 208 in FIG. 2B) including a first upper source/drain region 406*a*, a second upper source/drain region 406*b*, an upper channel region 410, and an upper gate electrode 416*b*. The lower transistor and the upper transistor may have the same conductivity type (e.g., a P-type conductivity or a N-type conductivity). For example, the lower transistor and the upper transistor may have a P-type conductivity.

Figure 4B:
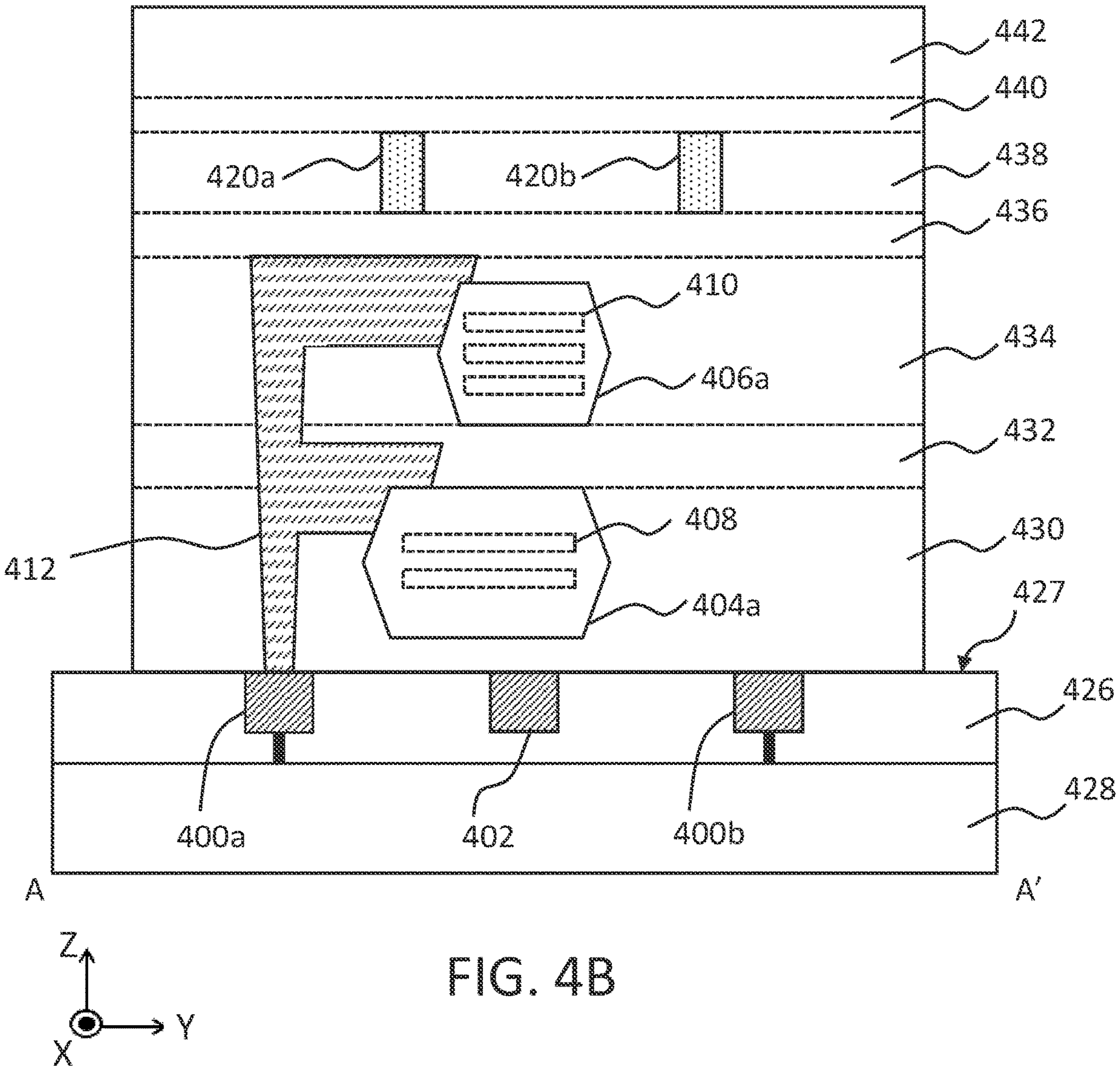
FIGS. 4B, 4C, 4D, 4E, and 4F are, respectively, cross-sectional views taken along the line A-A', the line B-B', the line C-C', the line D-D', and the line E-E' in FIG. 4A, according to some embodiments.
Figure 4C:
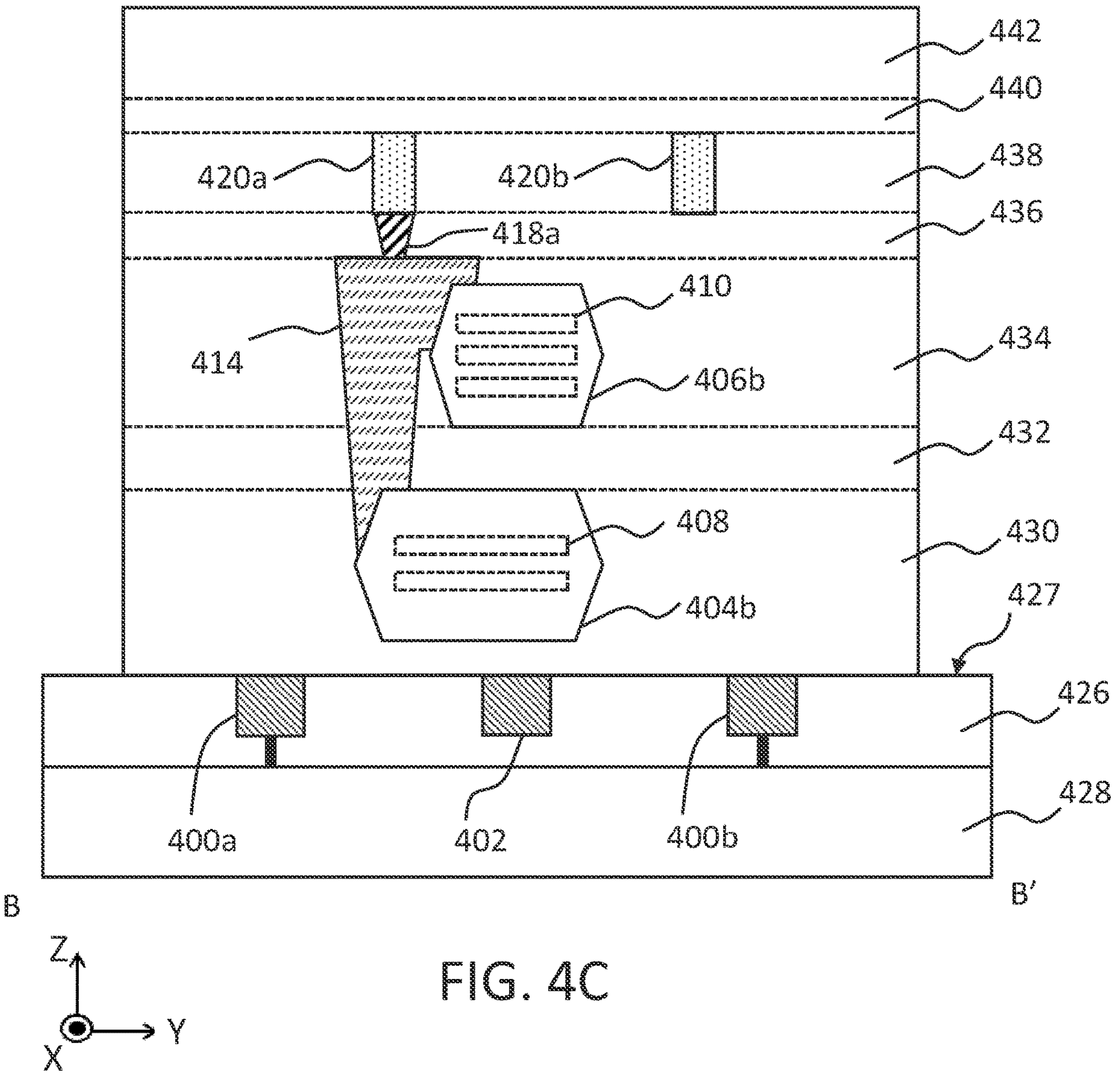

In FIGS. 4B and 4C, positions of the lower channel region 408 and the upper channel region 410 are represented by the dotted lines. Although FIGS. 4B through 4F illustrate that the lower channel region 408 includes two channel regions, and the upper channel region 410 includes three channel regions, in some embodiments, the number of channel regions included in the lower channel region 408 or the upper channel region 410 may be different from illustrated. In some embodiments, the number of channel regions included in the lower channel region 408 or the upper channel region 410 may be one or more than three.

The lower channel region 408 may include opposing sides spaced apart from each other in a first horizontal direction (e.g., an X direction, also referred to as a first direction), and the first lower source/drain region 404*a* and the second lower source/drain region 404*b* may be on (e.g., may contact) the opposing sides of the lower channel region 408, respectively. The upper channel region 410 may include opposing sides spaced apart from each other in the first horizontal direction, and the first upper source/drain region 406*a* and the second upper source/drain region 406*b* may be on (e.g., may contact) the opposing sides of the upper channel region 410, respectively.

The first lower source/drain region 404*a* and the first upper source/drain region 406*a* may be electrically connected to each other. In some embodiments, a first conductive contact 412 may electrically connect the first lower source/drain region 404*a* to the first upper source/drain region 406*a*. For example, the first conductive contact 412 may contact both the first lower source/drain region 404*a* and the first upper source/drain region 406*a*.

The second lower source/drain region 404*b* and the second upper source/drain region 406*b* may be electrically connected to each other. In some embodiments, a second conductive contact 414 may electrically connect the second lower source/drain region 404*b* to the second upper source/drain region 406*b*. For example, the second conductive contact 414 may contact both the second lower source/drain region 404*b* and the second upper source/drain region 406*b*. For example, the second upper source/drain region 406*b* and the second lower source/drain region 404*b* may be electrically connected to the first power 106. All of the first lower source/drain region 404*a*, the second lower source/drain region 404*b*, the first upper source/drain region 406*a*, and the second upper source/drain region 406*b* may have the same conductivity type (e.g., a P-type conductivity or a N-type conductivity).

The lower gate electrode 416*a* may be on the lower channel region 408, and the upper gate electrode 416*b* may be on the upper channel region 410. Although not illustrated, a lower gate insulator may extend between the lower gate electrode 416*a* and the lower channel region 408, and an upper gate insulator may extend between the upper gate electrode 416*b* and the upper channel region 410.

The lower gate electrode 416*a* and the upper gate electrode 416*b* may be electrically connected to each other. In some embodiments, the lower gate electrode 416*a* and the upper gate electrode 416*b* may be electrically connected to each other through a gate connector 416*c*. In some embodiments, the lower gate electrode 416*a*, the upper gate electrode 416*b*, and the gate connector 416*c* contact each other and constitute a common gate electrode. The lower gate electrode 416*a* may be a first portion of the common gate electrode, the upper gate electrode 416*b* may be a second portion of the common gate electrode, and the gate connector 416*c* may be a third portion of the common gate electrode.

Figure 4D:
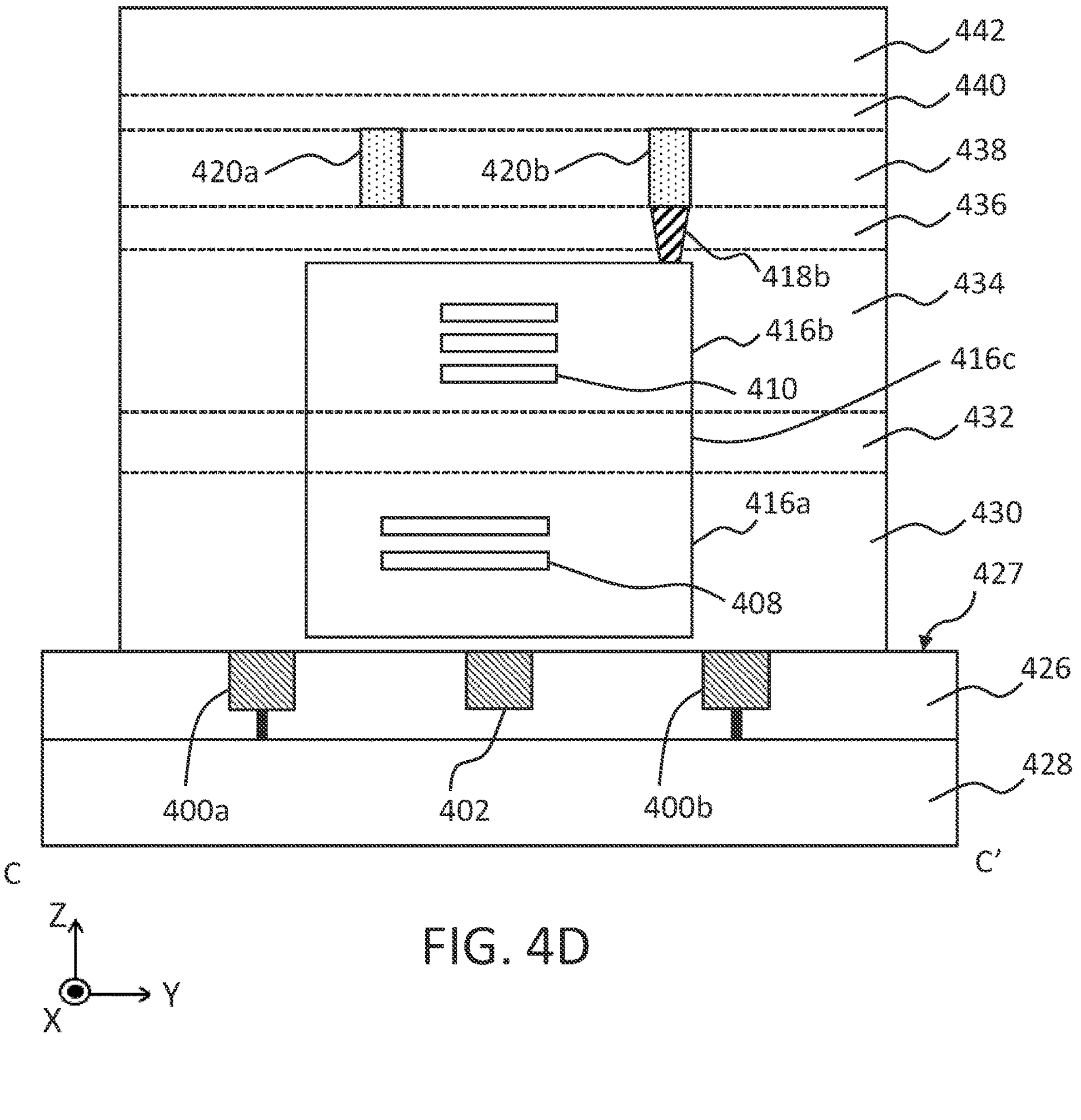

The gate connector 416*c* may include a material the same as or different from the lower and upper gate electrodes 416*a* and 416*b*. Although FIG. 4D illustrates that the lower and upper gate electrodes 416*a* and 416*b* and the gate connector 416*c* have an equal width in a second horizontal direction (e.g., a Y direction in FIG. 4D, also referred to as a second direction), in some embodiments, widths of the lower and upper gate electrodes 416*a* and 416*b* may be different from a width of the gate connector 416*c* in the second horizontal direction. Further, the lower and upper gate electrodes 416*a* and 416*b* may have different widths in the second horizontal direction. In some embodiments, the lower gate electrode 416*a*, the upper gate electrode 416*b*, and the gate connector 416*c* may have different widths in the second horizontal direction. The second horizontal direction may traverse (e.g., may be perpendicular to) the first horizontal direction. The third direction (e.g., the vertical direction) may traverse (e.g., may be perpendicular to) both the first horizontal direction and the second horizontal direction.

The lower channel region 408 and the upper channel region 410 may be spaced apart from each other in the vertical direction and may overlap each other in the vertical direction. In some embodiments, a portion of the lower channel region 408 and the upper channel region 410 may overlap each other in the vertical direction, as illustrated in FIG. 4D. As used herein, "an element A overlapping an element B in a direction X" (or similar language) means that there is at least one line that extends in the direction X and intersects both the elements A and B.

The lower transistor and the upper transistor may be stacked on a substrate 426 that includes an upper surface 427. A first power wire 400*a* or 400*b* and a second power wire 402 may be provided in the substrate 426. Upper surfaces of the first power wire 400*a* or 400*b* and the second power wire 402 may be coplanar with the upper surface 427 of the substrate 426. The first power wire 400*a* may be electrically connected to a virtual power (e.g., the virtual power 108 in FIG. 1). In some embodiments, the first power wire 400*a* or 400*b* and the second power wire 402 may extend longitudinally in the first horizontal direction.

The first power wire 400*a* may be electrically connected to the first conductive contact 412. Accordingly, the first power wire 400*a* may be electrically connected to the first lower source/drain region 404*a* and the first upper source/drain region 406*a* through the first conductive contact 412. The first power wire 400*a* may be electrically connected to the logic circuit block 102 through a backside power distribution network structure (BSPDNS) 428. The substrate 426 may extend between the lower transistor (e.g., the lower transistor 202 in FIG. 2A or the lower transistor 206 in FIG. 2B) and the BSPDNS 428. The BSPDNS 428 may include multiple wires, conductive contacts, and/or vias provided in insulating layer(s).

Referring to FIG. 4D, in some embodiments, the lower and upper gate electrodes 416*a* and 416*b* may overlap the second power wire 402 in the vertical direction. In some embodiments, the lower and upper gate electrodes 416*a* and 416*b* may traverse the second power wire 402.

A first lower wire 420*a* and a second lower wire 420*b* may be provided on the upper transistor (e.g., the upper transistor 204 in FIG. 2A or the upper transistor 208 in FIG. 2B). The first lower wire 420*a* and the second lower wire 420*b* may be spaced apart from each other in the second horizontal direction and may extend longitudinally in the first horizontal direction. The first and second upper source/drain regions 406*a* and 406*b* may be between the substrate 426 and the first lower wire 420*a* and the second lower wire 420*b* in the third direction.

The second conductive contact 414 may be electrically connected to the first lower wire 420*a*. In some embodiments, a first lower via 418*a* may be provided between the second conductive contact 414 and the first lower wire 420*a*. The first lower via 418*a* may contact both the second conductive contact 414 and the first lower wire 420*a*, and thus the second conductive contact 414 and the first lower wire 420*a* may be electrically connected to each other through the first lower via 418*a*.

The upper gate electrode 416*b* may be electrically connected to the second lower wire 420*b*. In some embodiments, a second lower via 418*b* may be provided between the upper gate electrode 416*b* and the second lower wire 420*b*. The second lower via 418*b* may contact both the upper gate electrode 416*b* and the second lower wire 420*b*, and thus the upper gate electrode 416*b* and the second lower wire 420*b* may be electrically connected to each other through the second lower via 418*b*. Further, the lower gate electrode 416*a* may also be electrically connected to the second lower wire 420*b* through the second lower via 418*b*.

Figure 4E:
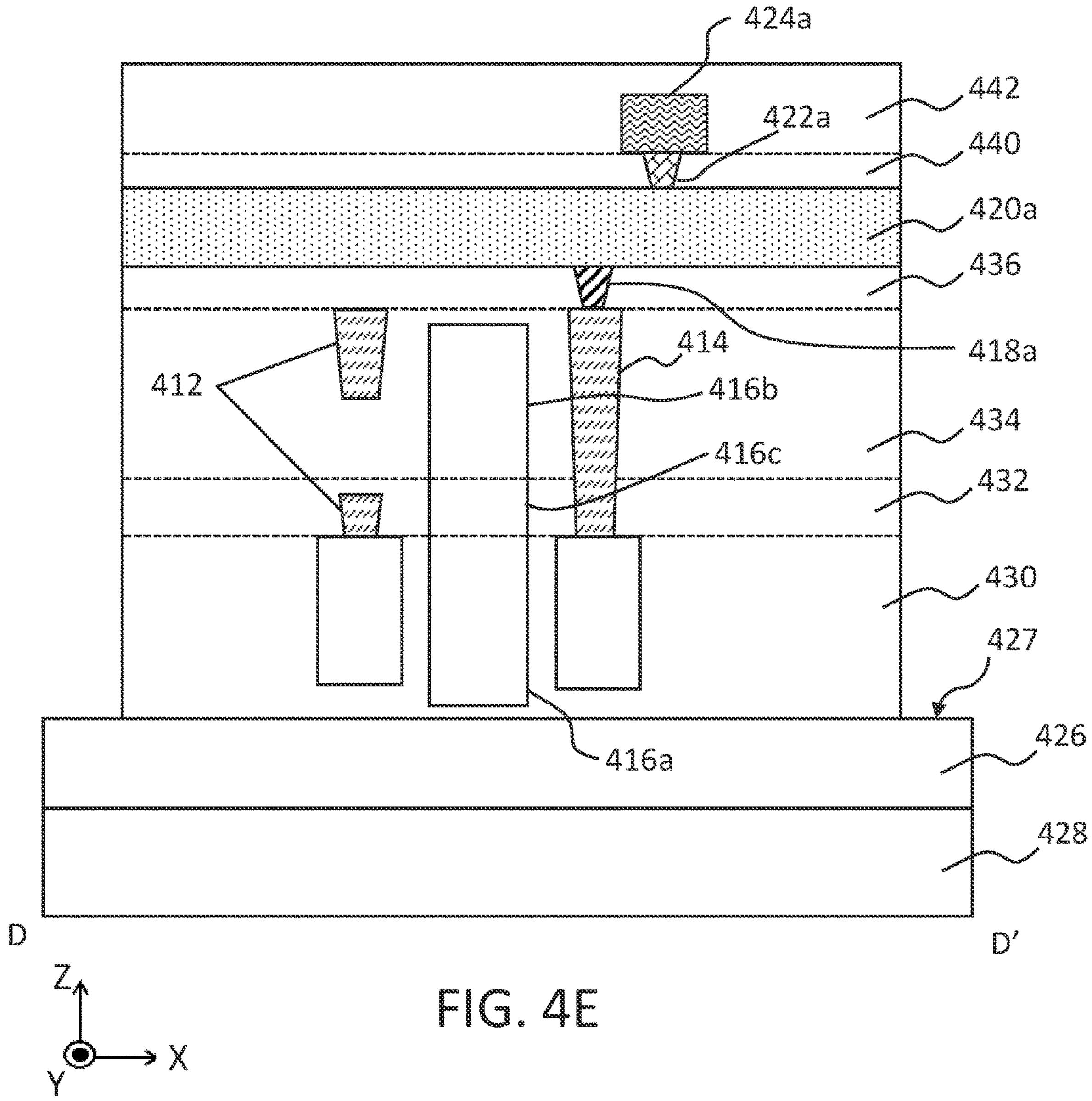
Figure 4F:
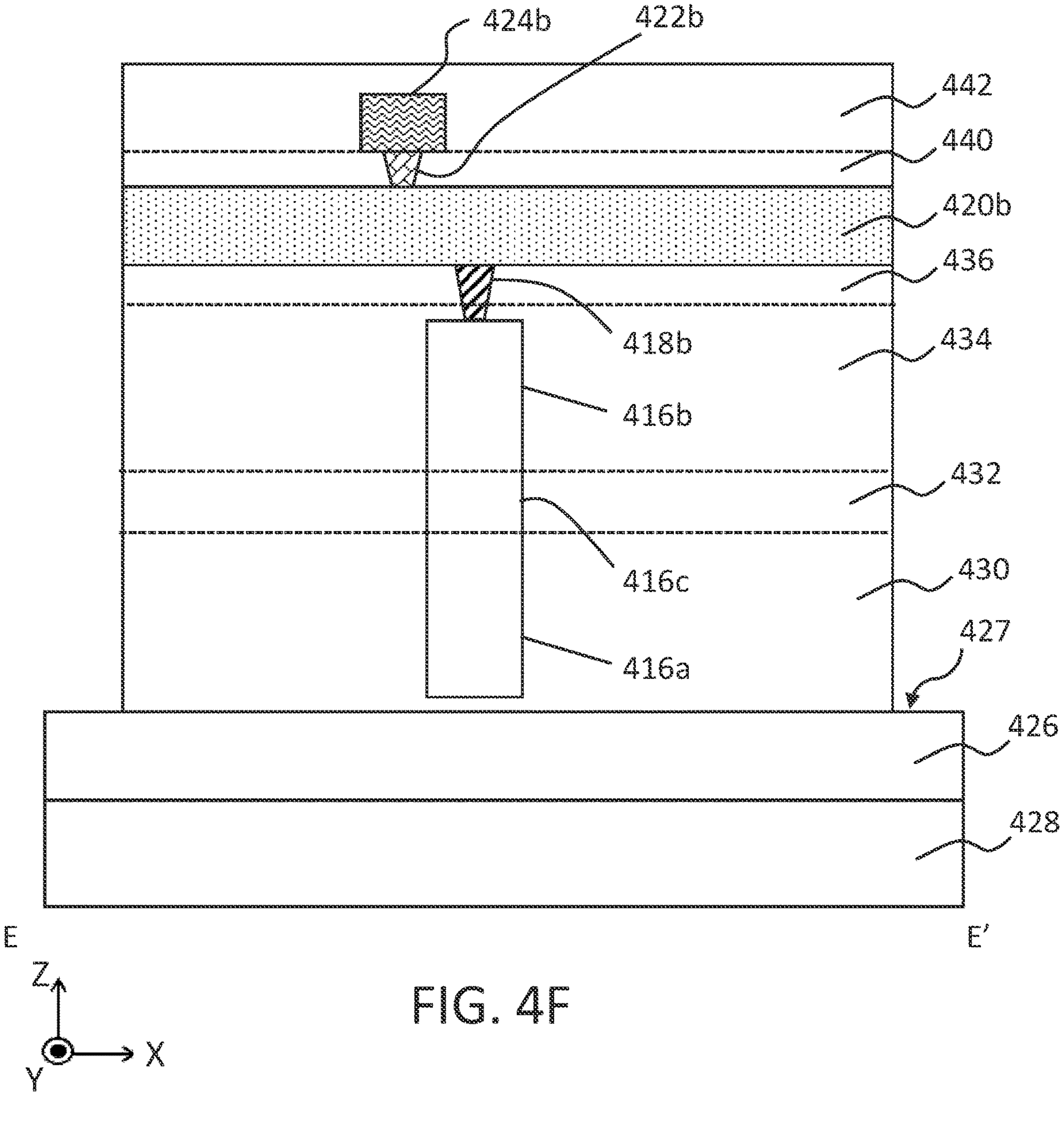

Referring to FIGS. 4A, 4E, and 4F, a first upper wire 424*a* and a second upper wire 424*b* may be provided on the first lower wire 420*a* and the second lower wire 420*b*. The first upper wire 424*a* and the second upper wire 424*b* may be spaced apart from each other in the first horizontal direction and may extend longitudinally in the second horizontal direction. The first lower wire 420*a* and the second lower wire 420*b* may be between the substrate 426 and the first upper wire 424*a* and the second upper wire 424*b*.

The first lower wire 420*a* may be electrically connected to the first upper wire 424*a*. In some embodiments, a first upper via 422*a* may be provided between the first lower wire 420*a* and the first upper wire 424*a*. The first upper via 422*a* may contact both the first lower wire 420*a* and the first upper wire 424*a*, and thus the first lower wire 420*a* and the first upper wire 424*a* may be electrically connected to each other through the first upper via 422*a*.

The second lower wire 420*b* may be electrically connected to the second upper wire 424*b*. In some embodiments, a second upper via 422*b* may be provided between the second lower wire 420*b* and the second upper wire 424*b*. The second upper via 422*b* may contact both the second lower wire 420*b* and the second upper wire 424*b*, and thus the second lower wire 420*b* and the second upper wire 424*b* may be electrically connected to each other through the second upper via 422*b*.

In some embodiments, the lower and upper transistors may be in first, second, and third insulating layers 430, 432, and 434. Further, the first and second lower vias 418*a* and 418*b* may be in a fourth insulating layer 436, the first and second lower wires 420*a* and 420*b* may be in a fifth insulating layer 438, the first and second upper vias 422*a* and 422*b* may be in a sixth insulating layer 440, and the first and second upper wires 424*a* and 424*b* may be in a seventh insulating layer 442. The first through seventh insulating layers 430, 432, 434, 436, 438, 440, and 442 may be sequentially stacked on the substrate 426. In some embodiments, interface(s) between the first through seventh insulating layers 430, 432, 434, 436, 438, 440, and 442 may not be visible.

Although FIG. 4A illustrates that the unit transistor stack of the power switch cell 104 has a double cell height, in some embodiments, the unit transistor stack of the power switch cell 104 may have a different cell height from what is illustrated. For example, the unit transistor stack of the power switch cell 104 may have a single cell height or a quad cell height.

Figure 5A:
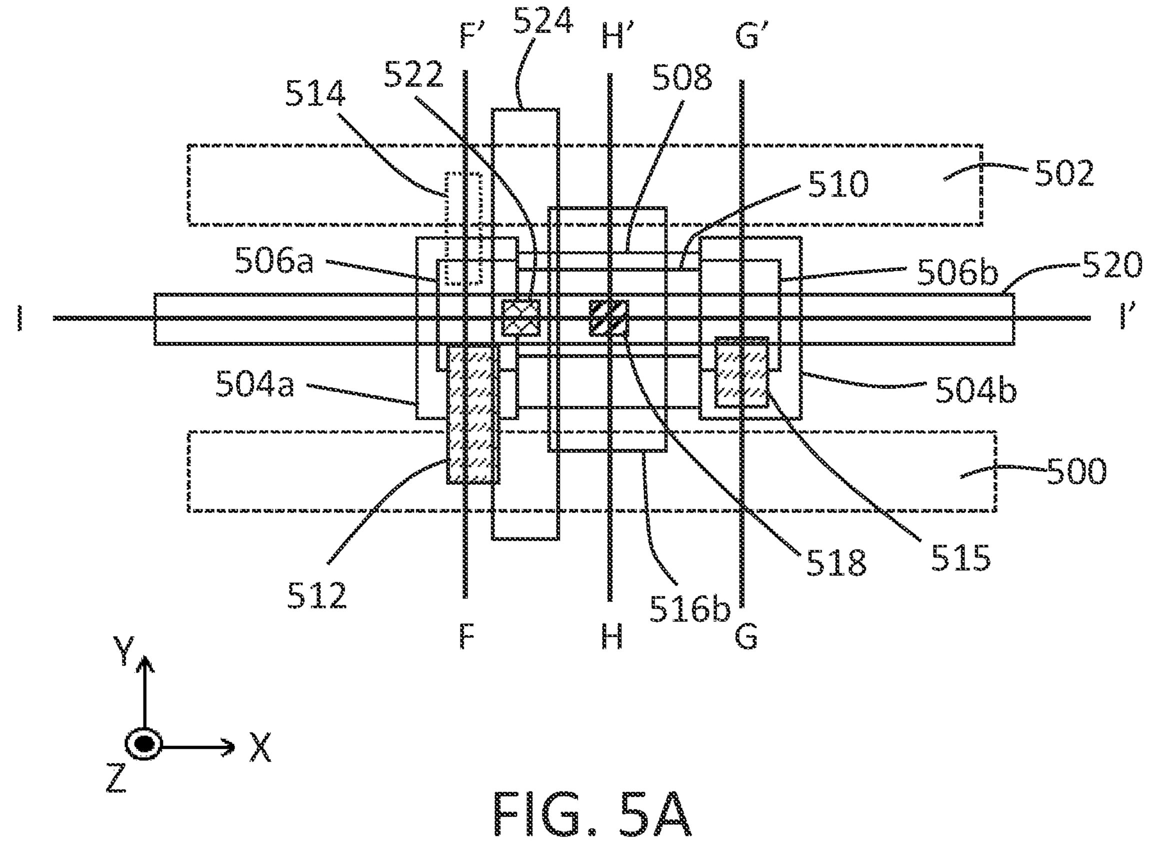
FIG. 5A is a layout of a unit logic transistor stack of a logic circuit block, according to some embodiments.

FIG. 5A is a layout of a unit logic transistor stack of the logic circuit block 102, according to some embodiments. FIGS. 5B, 5C, 5D, and 5E are, respectively, cross-sectional views taken along the line F-F', the line G-G', the line H-H' and the line I-I' in FIG. 5A, according to some embodiments.

Referring to FIGS. 5A through 5E, the unit logic transistor stack of the logic circuit block 102 may include a lower logic transistor (e.g., the lower logic transistor 302 in FIG. 3A or the lower logic transistor 306 in FIG. 3B) including a third lower source/drain region 504*a*, a fourth lower source/drain region 504*b*, a logic lower channel region 508, and a logic lower gate electrode 516*a*. The unit logic transistor stack of the logic circuit block 102 may also include an upper logic transistor (e.g., the upper logic transistor 304 in FIG. 3A or the upper logic transistor 308 in FIG. 3B) including a third upper source/drain region 506*a*, a fourth upper source/drain region 506*b*, a logic upper channel region 510, and a logic upper gate electrode 516*b*. The lower logic transistor and the upper logic transistor may have different conductivity types.

Figure 5B:
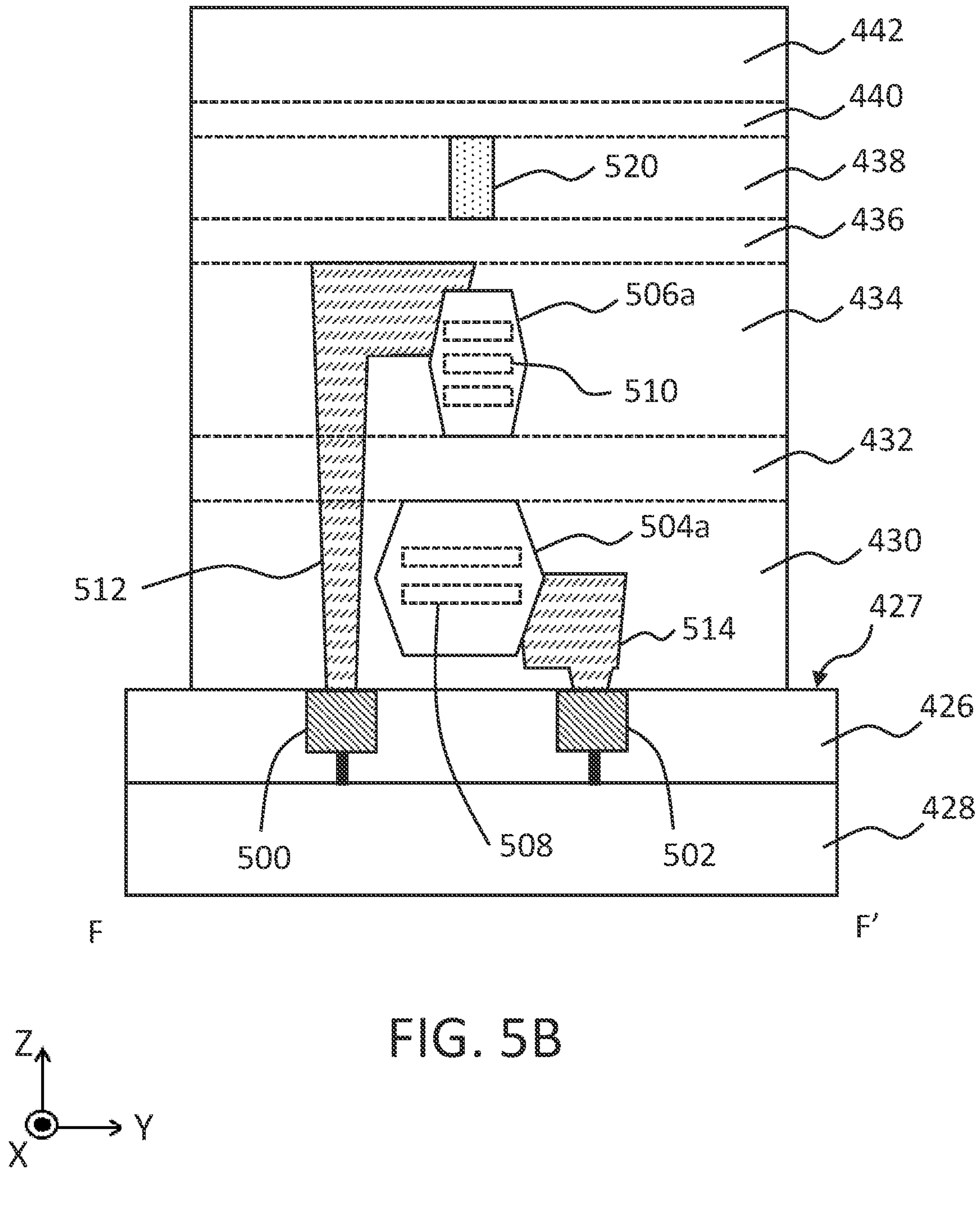
FIGS. 5B, 5C, 5D, and 5E are, respectively, cross-sectional views taken along the line F-F', the line G-G', the line H-H', and the line I-I' in FIG. 5A, according to some embodiments.
Figure 5C:
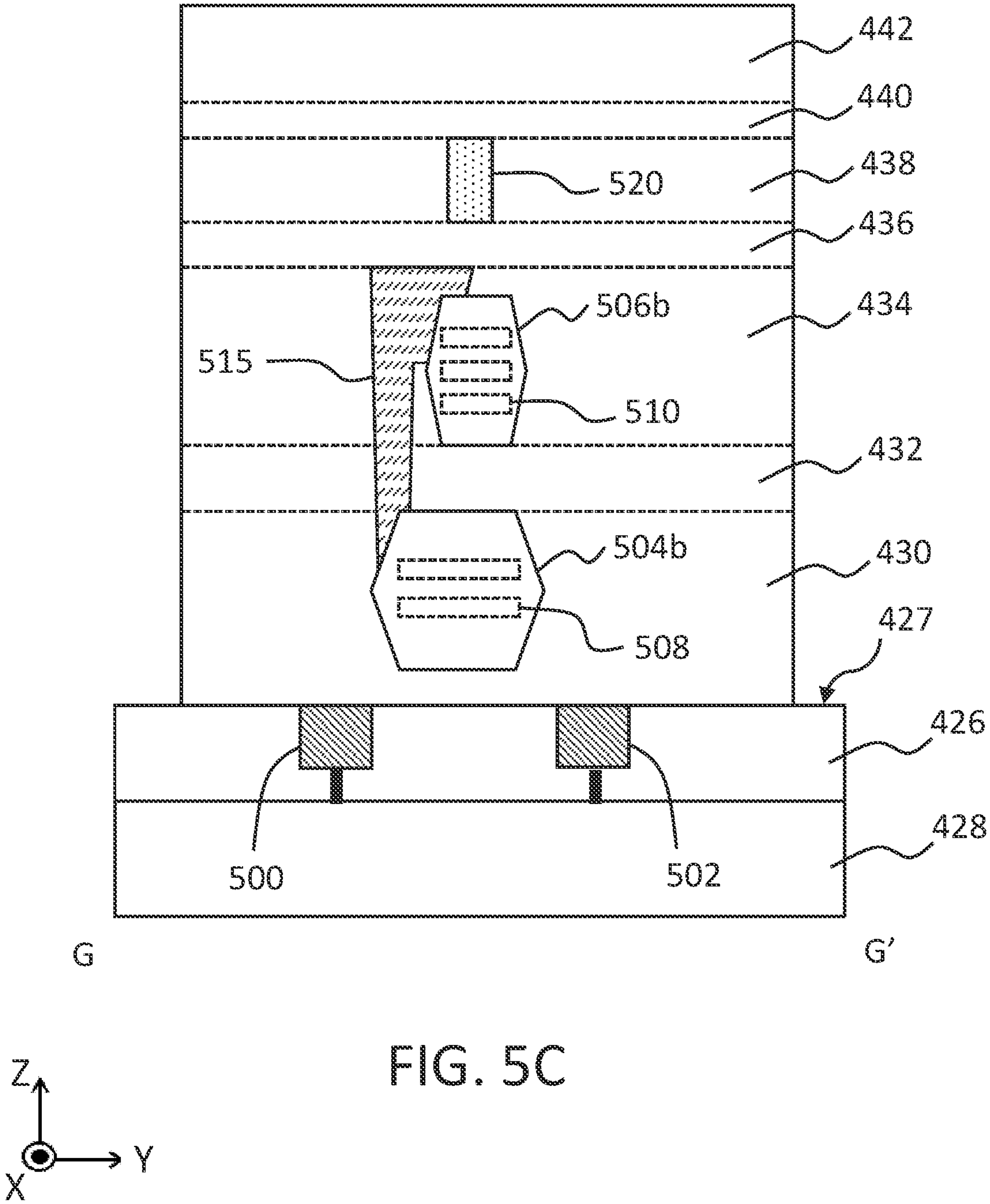

In FIGS. 5B and 5C, positions of the logic lower channel region 508 and the logic upper channel region 510 are represented by the dotted lines. Although FIGS. 5B through 5E illustrate that the logic lower channel region 508 includes two channel regions, and the logic upper channel region 510 includes three channel regions, in some embodiments, the number of channel regions included in the logic lower channel region 508 or the logic upper channel region 510 may be different from what is illustrated. The present inventive concept is not limited to the number of channel regions included in the logic lower channel region 508 or the logic upper channel region 510. In some embodiments, the number of channel regions included in the logic lower channel region 508 or the logic upper channel region 510 may be one or more than three.

The logic lower channel region 508 may include opposing sides spaced apart from each other in the first horizontal direction, and the third lower source/drain region 504*a* and the fourth lower source/drain region 504*b* may be on (e.g., may contact) the opposing sides of the logic lower channel region 508, respectively. The logic upper channel region 510 may include opposing sides spaced apart from each other in the first horizontal direction, and the third upper source/drain region 506*a* and the fourth upper source/drain region 506*b* may be on (e.g., may contact) the opposing sides of the logic upper channel region 510, respectively.

A third power wire 500 and a fourth power wire 502 may be provided in the substrate 426. Upper surfaces of the third power wire 500 and the fourth power wire 502 may be coplanar with the upper surface 427 of the substrate 426. The third power wire 500 may be electrically connected to the virtual power (e.g., the virtual power 108 in FIG. 1). The third power wire 500 may be electrically connected to the first power wire (e.g., the first power wire 400*a* in FIG. 4B) through the BSPDNS 428. The fourth power wire 502 may be electrically connected to the second power (the second power 110 in FIG. 1) having a second voltage (e.g., a source voltage $V_{SS}$). The fourth power wire 502 may be electrically connected to the second power through the BSPDNS 428. In some embodiments, the third power wire 500 and the fourth power wire 502 may extend longitudinally in the first horizontal direction.

The third upper source/drain region 506*a* may be electrically connected to the third power wire 500. In some embodiments, a third conductive contact 512 may electrically connect the third upper source/drain region 506*a* to the third power wire 500. The third conductive contact 512 may contact both the third upper source/drain region 506*a* and the third power wire 500.

The third lower source/drain region 504*a* may be electrically connected to the fourth power wire 502. In some embodiments, a fourth conductive contact 514 may electrically connect the third lower source/drain region 504*a* to the fourth power wire 502. The fourth conductive contact 514 may contact both the third lower source/drain region 504*a* and the fourth power wire 502.

The fourth lower source/drain region 504*b* and the fourth upper source/drain region 506*b* may be electrically connected to each other. In some embodiments, a fifth conductive contact 515 may electrically connect the fourth lower source/drain region 504*b* and the fourth upper source/drain region 506*b*. The fifth conductive contact 515 may contact both the fourth lower source/drain region 504*b* and the fourth upper source/drain region 506*b*.

The logic lower gate electrode 516*a* may be on the logic lower channel region 508, and the logic upper gate electrode 516*b* may be on the logic upper channel region 510. Although not illustrated, a logic lower gate insulator may extend between the logic lower gate electrode 516*a* and the logic lower channel region 508, and a logic upper gate insulator may extend between the logic upper gate electrode 516*b* and the logic upper channel region 510.

Figure 5D:
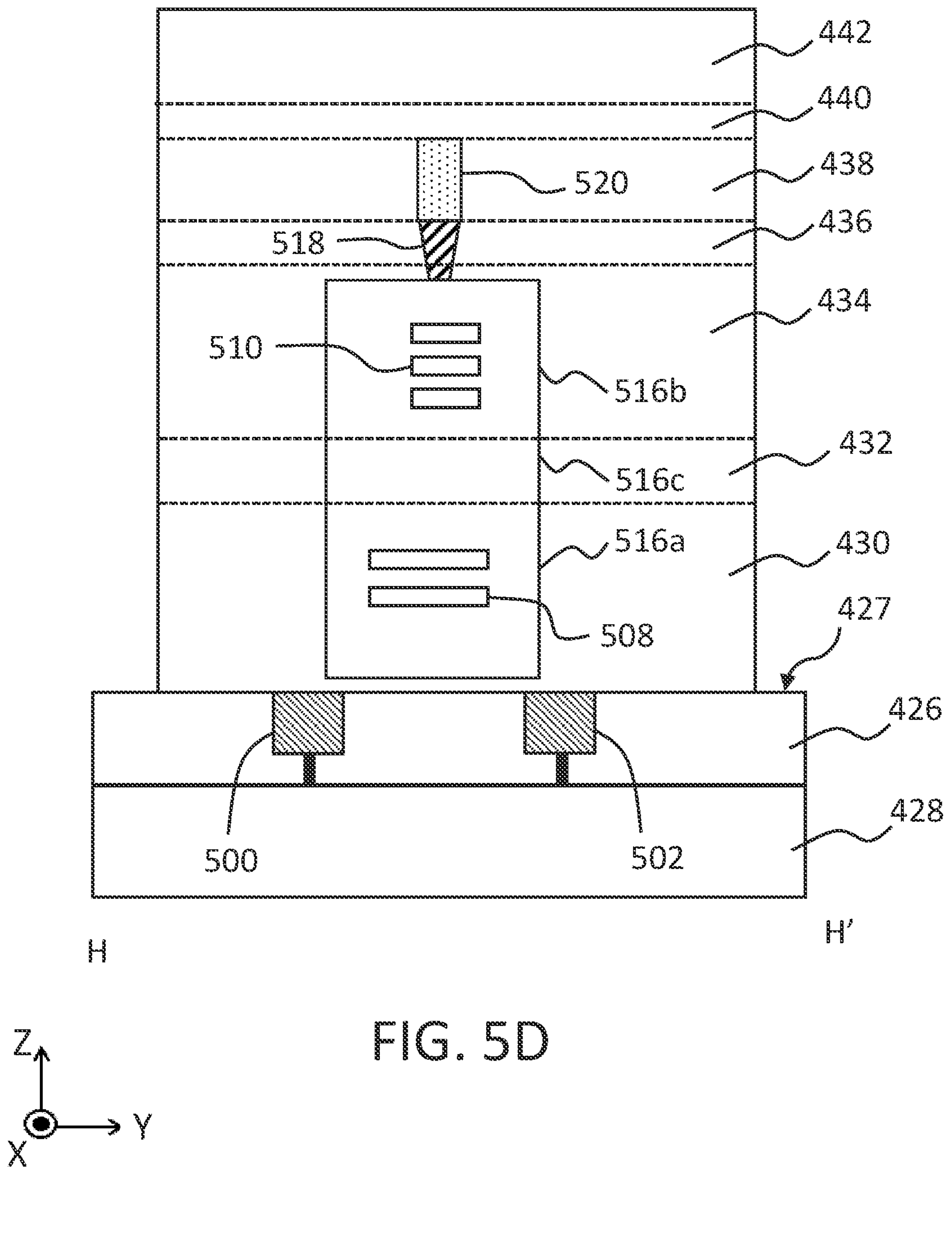

The logic lower gate electrode 516*a* and the logic upper gate electrode 516*b* may be electrically connected to each other. In some embodiments, the logic lower gate electrode 516*a* and the logic upper gate electrode 516*b* may be electrically connected to each other through a logic gate connector 516*c*. In some embodiments, the logic lower gate electrode 516*a*, the logic upper gate electrode 516*b*, and the logic gate connector 516*c* contact each other and constitute a logic common gate electrode. The logic lower gate electrode 516*a* may be a first portion of the logic common gate electrode, and the logic upper gate electrode 516*b* may be a second portion of the logic common gate electrode, and the logic gate connector 516*c* may be a third portion of the logic common gate electrode. The logic gate connector 516*c* may include a material the same as or different from the logic lower and logic upper gate electrodes 516*a* and 516*b*. Although FIG. 5D illustrates that the logic lower and logic upper gate electrodes 516*a* and 516*b* and the logic gate connector 516*c* have an equal width in the second horizontal direction, in some embodiments, widths of the logic lower and logic upper gate electrodes 516*a* and 516*b* may be different from a width of the logic gate connector 516*c* in the second horizontal direction. Further, the logic lower and logic upper gate electrodes 516*a* and 516*b* may have different widths in the second horizontal direction. In some embodiments, the logic lower gate electrode 516*a*, the logic upper gate electrode 516*b*, and the logic gate connector 516*c* may have different widths.

The logic lower channel region 508 and the logic upper channel region 510 may be spaced apart from each other in the vertical direction and may overlap each other in the vertical direction. In some embodiments, a portion of the logic lower channel region 508 and the logic upper channel region 510 may overlap each other in the vertical direction as illustrated in FIG. 5D.

Referring to FIG. 5D, in some embodiments, portions of the logic lower and logic upper gate electrodes 516*a* and 516*b* may overlap the third and fourth power wires 500 and 502 in the vertical direction.

A third lower wire 520 may be provided on the upper logic transistor (e.g., the upper logic transistor 304 in FIG. 3A or the upper logic transistor 308 in FIG. 3B). The third lower wire 520 may extend longitudinally in the first horizontal direction. The third and fourth upper source/drain regions 506*a* and 506*b* may be between the substrate 426 and the third lower wire 520.

Figure 5E:
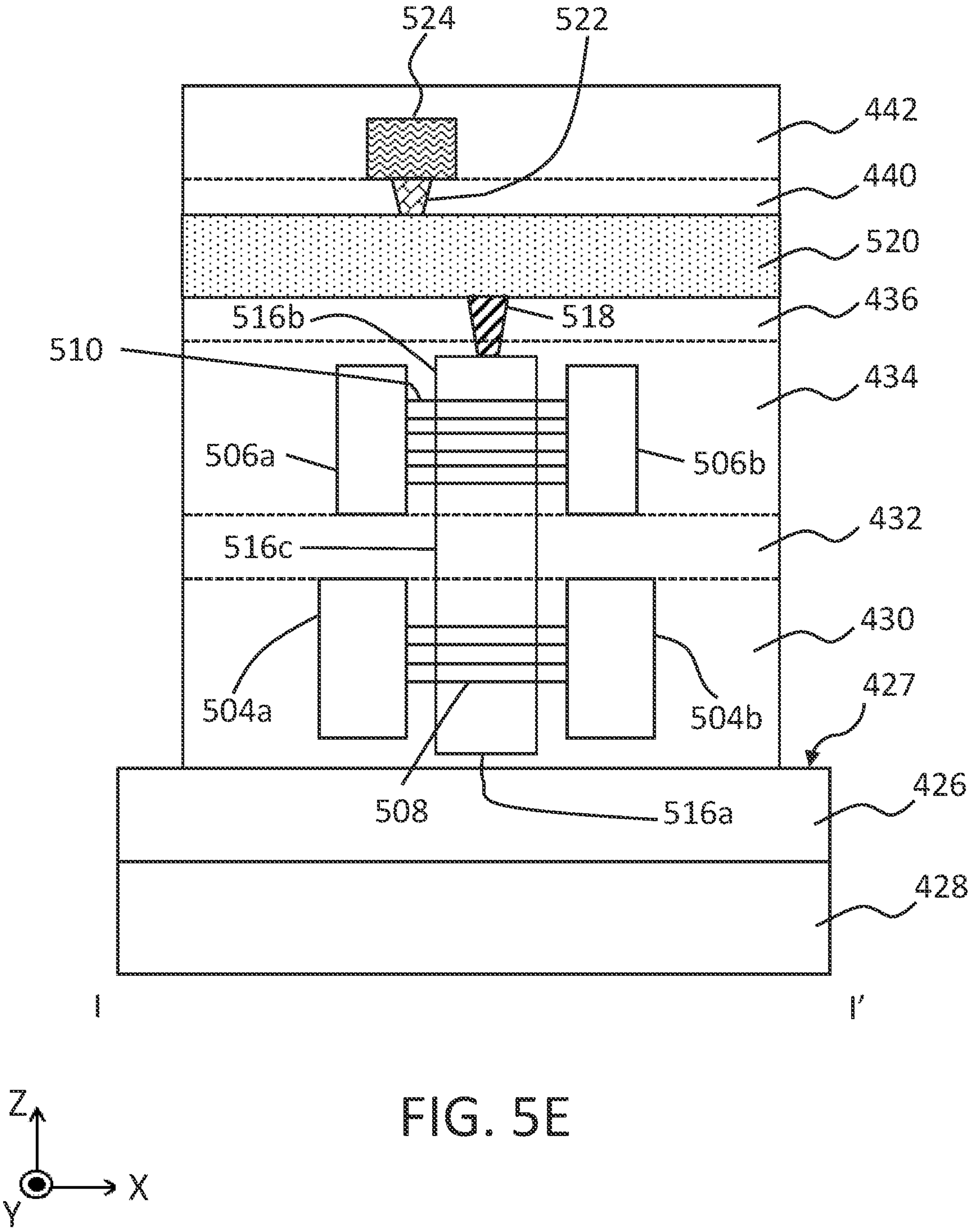

Referring to FIGS. 5D and 5E, the logic upper gate electrode 516*b* may be electrically connected to the third lower wire 520. In some embodiments, a third lower via 518 may be provided between the logic upper gate electrode 516*b* and the third lower wire 520. The third lower via 518 may contact both the logic upper gate electrode 516*b* and the third lower wire 520, and thus the logic upper gate electrode 516*b* and the third lower wire 520 may be electrically connected to each other through the third lower via 518. Further, the logic lower gate electrode 516*a* may also be electrically connected to the third lower wire 520 through the third lower via 518.

A third upper wire 524 may be provided on the third lower wire 520. The third upper wire 524 may extend longitudinally in the second horizontal direction. The third lower wire 520 may be between the substrate 426 and the third upper wire 524.

The third lower wire 520 may be electrically connected to the third upper wire 524. In some embodiments, a third upper via 522 may be provided between the third lower wire 520 and the third upper wire 524. The third upper via 522 may contact both the third lower wire 520 and the third upper wire 524, and thus the third lower wire 520 and the third upper wire 524 may be electrically connected to each other through the third upper via 522.

In some embodiments, the lower and upper logic transistors may be in the first, second, and third insulating layers 430, 432, and 434. Further, the third lower vias 518 may be in the fourth insulating layer 436, the third lower wire 520 may be in the fifth insulating layer 438, the third upper via 522 may be in the sixth insulating layer 440, and the third upper wire 524 may be in the seventh insulating layer 442.

Although the first power wire 400*a* and the third power wire 500 are described as being electrically connected through the BSPDNS 428, in some embodiments, the first power wire 400*a* and the third power wire 500 may be electrically connected to each other through a front side power distribution network structure (FSPDNS). The upper surface 427 may face the FSPDNS. Similar to the BSPDNS 428, the FSPDNS may also include multiple wires, contacts, and vias provided in insulating layer(s).

Although FIG. 5A illustrates that the unit logic transistor stack of the logic circuit block 102 has a single cell height, in some embodiments, the unit logic transistor stack of the logic circuit block 102 may have a different cell height from what is illustrated. For example, the unit logic transistor stack of the logic circuit block 102 may have a double cell height or a quad cell height.

In some embodiments, elements formed in the same insulating layer (e.g., one of the first, second, third, fourth, fifth, sixth, and seventh insulating layers 430, 432, 434. 436, 438, 440, and 442) may be formed through the same process(es) and/or may include the same material(s). For example, the first, second, third, and fourth lower source/drain regions 404*a*, 404*b*, 504*a*, and 504*b* may be formed by the same epitaxial growth process and thus may include the same material(s), and the first, second, and third lower wires 420*a*, 420*b*, and 520 may be formed by the same deposition process(es) and the same patterning process(es) and thus may include the same material(s). Accordingly, according to some embodiments, a logic circuit block (e.g., the logic circuit block 102 in FIG. 1) and a power switch cell (e.g., the power switch cell 104 in FIG. 1) may be formed, at least partially, by the same processes.

The substrate 426 may include one or more semiconductor materials, for example, Si, Ge, SiGe, GaP, GaAs, SiC, SiGeC, and/or InP, but is not limited thereto. In some embodiments, the substrate 426 may be a bulk substrate (e.g., a bulk silicon substrate) or a semiconductor on insulator (SOI) substrate. For example, the substrate 426 may be a silicon wafer.

For example, the channel regions (e.g., 408, 410, 508, and 510) may include, each independently, semiconductor material(s) (e.g., Si, Ge, SiGe, GaP, GaAs, SiC, SiGeC, and/or InP). Each of the lower channel region 408, the upper channel region 410, the logic lower channel region 508, and the logic upper channel region 510 may be a nanosheet that may have a thickness in a range of from 1 nm to 100 nm in the vertical direction or may be a nanowire that may have a circular cross-section with a diameter in a range of from 1 nanometer (nm) to 100 nm. However, the present inventive concept is not limited to the shapes and sizes of the channel regions.

For example, the source/drain regions (e.g., 404*a*, 404*b*, 406*a*, 406*b*, 504*a*, 504*b*, 506*a*, 506*b*) may include, each independently, a semiconductor material (e.g., Si, Ge, SiGe, GaP, GaAs, SiC, SiGeC, and/or InP) including dopant(s) (e.g., boron, phosphorus, and/or arsenic).

For example, the gate electrodes (e.g., 416*a*, 416*b*, 516*a*, and 516*b*), the gate connector 416*c*, and the logic gate connector 516*c* may include, each independently, a metallic layer including metal element(s) (e.g., tungsten, aluminum, copper, molybdenum, and/or ruthenium) and may additionally include work function layer(s) (e.g., a TiN layer, a TaN layer, a TiAl layer, a TiC layer, a TiAlC layer, a TiAlN layer, and/or a WN layer).

For example, the conductive elements (e.g., 400*a*, 400*b*, 402, 412, 414, 418*a*, 418*b*, 420*a*, 420*b*, 422*a*, 422*b*, 424*a*, 424*b*, 500, 502, 512, 514, 515, 518, 520, 522, and 524) may include, each independently, a semiconductor material (e.g., Si, Ge, SiGe, GaP, GaAs, SiC, SiGeC, and/or InP) including dopant(s) (e.g., boron, phosphorus, and/or arsenic) and/or a metallic layer including metal element(s) (e.g., tungsten, aluminum, copper, molybdenum, and/or ruthenium).

For example, the insulating layer (e.g., 430, 432, 434, 436, 438, 440, and 442) may include, each independently, silicon oxide, silicon oxynitride, silicon nitride, silicon carbonitride, and/or low-k material. The low-k material may be a dielectric material having a lower dielectric constant than silicon dioxide.

Figure 6:
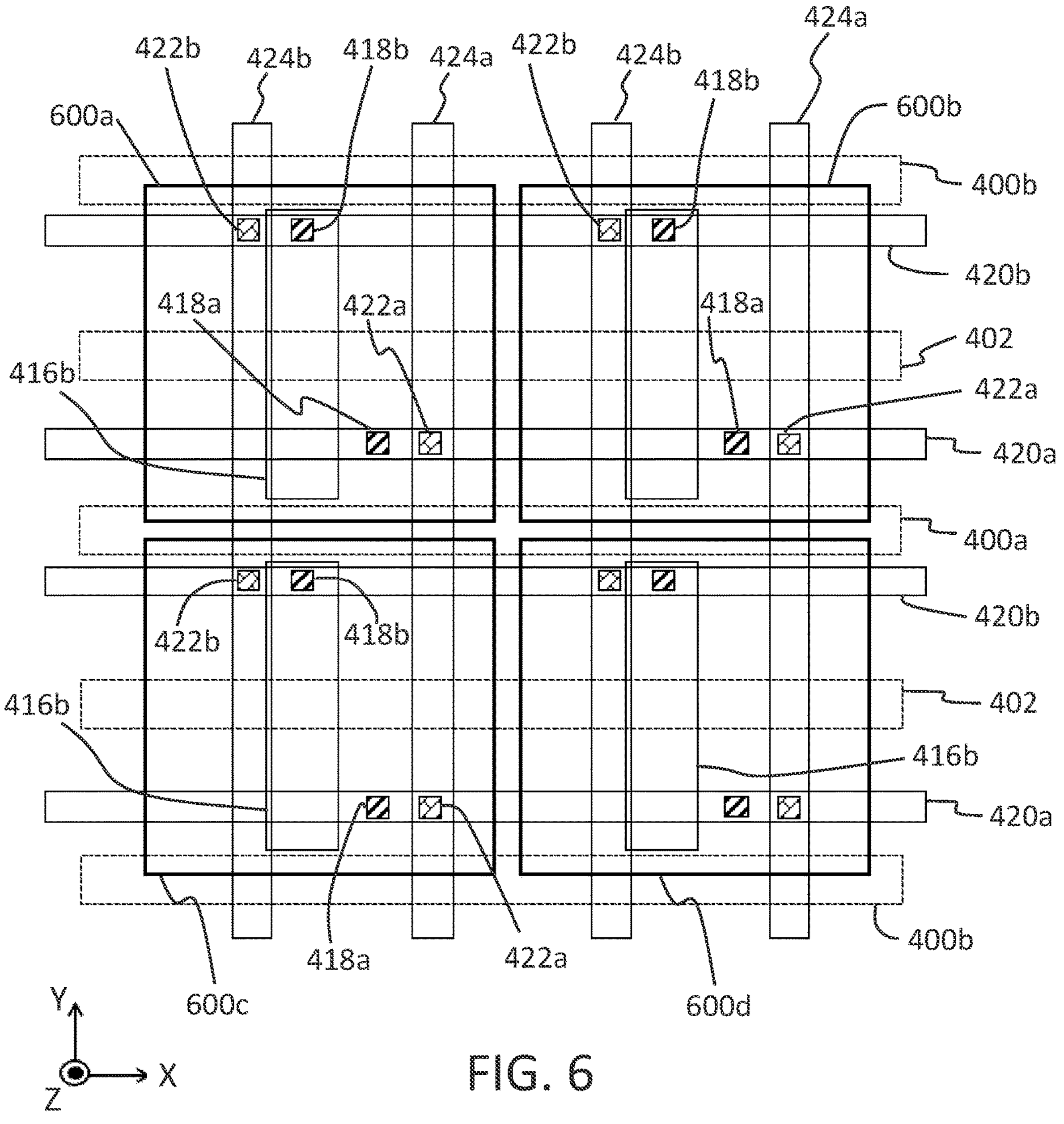
FIG. 6 is a layout of a power switch cell including unit transistor stacks, according to some embodiments.

FIG. 6 is a layout of the power switch cell 104, including the first, second, third, and fourth unit transistor stacks 600*a*, 600*b*, 600*c*, and 600*d*, according to some embodiments. Each of the first, second, third, and fourth unit transistor stacks 600*a*, 600*b*, 600*c*, and 600*d* may have the same layout of the unit transistor stack illustrated in FIG. 4A. For simplicity of illustration, only a group of elements illustrated in FIG. 4A are shown in FIG. 6.

Referring to FIG. 6, the single first upper wire 424*a*, which is electrically connected to the first power 106, may be electrically connected to two first upper vias 422*a* of the first and third unit transistor stacks 600*a* and 600*c*, and the single second upper wire 424*b*, which receives the sleep signal 210, may be electrically connected to two second upper vias 422*b* of the first and third unit transistor stacks 600*a* and 600*c*.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising." "includes," and/or "including." when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled." "connected." or "responsive" to, or "on," another element, it can be directly coupled, connected, or responsive to, or on, the other element, or intervening elements may also be present. In contrast, when an element is referred to as being "directly coupled." "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for case of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:

a power switch cell comprising:

an upper transistor on a substrate, wherein the upper transistor comprises an upper channel region, first and second upper source/drain regions respectively on opposing sides of the upper channel region, and an upper gate electrode on the upper channel region; and a lower transistor between the substrate and the upper transistor, wherein the lower transistor comprises a lower channel region, first and second lower source/ drain regions respectively on opposing sides of the lower channel region, and a lower gate electrode on the lower channel region, wherein the first and second upper source/drain regions and the first and second lower source/drain regions have the same conductivity type, the first upper source/drain region and the first lower source/drain region are directly electrically connected to each other, the second upper source/drain region and the second lower source/drain region are directly electrically connected to each other, and the upper gate electrode and the lower gate electrode are electrically connected to each other.

2. The integrated circuit device of claim 1, wherein the upper channel region and the lower channel region are spaced apart from each other in a vertical direction and overlap each other in the vertical direction.

3. The integrated circuit device of claim 1, further comprising a first conductive contact contacting both the first upper source/drain region and the first lower source/drain region.

4. The integrated circuit device of claim 3, further comprising a first power wire that is in the substrate, wherein the first conductive contact is electrically connected to the first power wire.

5. The integrated circuit device of claim 4, further comprising a logic circuit block, wherein the first power wire is electrically connected to the logic circuit block.

6. The integrated circuit device of claim 1, further comprising a second conductive contact contacting both the second upper source/drain region and the second lower source/drain region.

7. The integrated circuit device of claim 6, further comprising a first lower wire, wherein the second upper source/drain region is between the substrate and the first lower wire, and the second conductive contact is electrically connected to the first lower wire.

8. The integrated circuit device of claim 1, wherein the lower gate electrode is a first portion of a common gate electrode, and the upper gate electrode is a second portion of the common gate electrode.

9. The integrated circuit device of claim 1, further comprising a second lower wire, wherein the upper gate electrode is between the substrate and the second lower wire, and the second lower wire is electrically connected to the upper gate electrode.

10. The integrated circuit device of claim 1, wherein the first and second lower source/drain regions are spaced apart from each other in a first horizontal direction, the integrated circuit device further comprises first and second power wires that are in the substrate and are spaced apart from each other in a second horizontal direction that is perpendicular to the first horizontal direction, and the first upper source/drain region and the first lower source/drain region are electrically connected to the first power wire, and the upper and lower gate electrodes overlap the second power wire in a vertical direction that is perpendicular to the first and second horizontal directions.

11. The integrated circuit device of claim 1, further comprising a logic circuit block, wherein the first upper source/drain region and the first lower source/drain region are electrically connected to the logic circuit block.

12. The integrated circuit device of claim 11, further comprising a backside power distribution network structure (BSPDNS), wherein the first upper source/drain region and the first lower source/drain region are electrically connected to the logic circuit block through the BSPDNS.

13. The integrated circuit device of claim 1, wherein the second upper source/drain region and the second lower source/drain region are electrically connected to a first power having a positive voltage.

14. An integrated circuit device comprising:

an upper transistor on a substrate, wherein the upper transistor comprises an upper channel region, first and second upper source/drain regions respectively on opposing sides of the upper channel region, and an upper gate electrode; and a lower transistor between the substrate and the upper transistor, wherein the lower transistor comprises a lower channel region, first and second lower source/drain regions respectively on opposing sides of the lower channel region, and a lower gate electrode, wherein the upper transistor and the lower transistor have the same conductivity type, the first upper source/drain region and the first lower source/drain region are directly electrically connected to each other, and the second upper source/drain region and the second lower source/drain region are directly electrically connected to each other.

15. The integrated circuit device of claim 14, wherein the upper channel region and the lower channel region are spaced apart from each other in a vertical direction and overlap each other in the vertical direction.

16. The integrated circuit device of claim 14, further comprising:

a first power wire that is in the substrate and is electrically connected to the first upper source/drain region and the first lower source/drain region; and a first lower wire that is electrically connected to the second upper source/drain region and the second lower source/drain region, wherein the second upper source/drain region is between the substrate and the first lower wire.

17. The integrated circuit device of claim 14, wherein the upper gate electrode and the lower gate electrode are electrically connected to each other.

18. The integrated circuit device of claim 17, further comprising a second lower wire that is electrically connected to the upper gate electrode and the lower gate electrode, wherein the upper gate electrode is between the substrate and the second lower wire.

19. A method of forming an integrated circuit device, the method comprising:

forming a lower transistor on a substrate, wherein the lower transistor comprises a lower channel region, first and second lower source/drain regions respectively on opposing sides of the lower channel region, and a lower gate electrode; and forming an upper transistor on the lower channel region, wherein the upper transistor comprises an upper channel region, first and second upper source/drain regions respectively on opposing sides of the upper channel region, and an upper gate electrode, wherein the first lower source/drain region and the first upper source/drain region have the same conductivity type, the first upper source/drain region and the first lower source/drain region are electrically directly connected to each other, and the second upper source/drain region and the second lower source/drain region are directly electrically connected to each other.

20. The method of claim 19, wherein the upper gate electrode and the lower gate electrode are electrically connected to each other.

* * * * *